(12) United States Patent
Canaperi et al.

(10) Patent No.: US 9,449,810 B2
(45) Date of Patent: Sep. 20, 2016

(54) ADVANCED ULTRA LOW K SICOH DIELECTRICS PREPARED BY BUILT-IN ENGINEERED PORE SIZE AND BONDING STRUCTURED WITH CYCLIC ORGANOSILICON PRECURSORS

(71) Applicant: International Business Machines Corporation, Armonk, NY (US)

(72) Inventors: Donald F. Canaperi, Bridgewater, CT (US); Son V. Nguyen, Schenectady, NY (US); Deepika Priyadarshini, Guilderland, NY (US); Hosadurga K. Shobha, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/847,350

(22) Filed: Sep. 8, 2015

(65) Prior Publication Data

US 2016/0005597 A1 Jan. 7, 2016

Related U.S. Application Data

(63) Continuation of application No. 14/225,810, filed on Mar. 26, 2014, now Pat. No. 9,209,017.

(51) Int. Cl.
*H01L 21/47* (2006.01)
*H01L 21/02* (2006.01)
*H01B 3/46* (2006.01)
*H01L 23/532* (2006.01)

(52) U.S. Cl.
CPC ........... *H01L 21/02126* (2013.01); *H01B 3/46* (2013.01); *H01L 21/02203* (2013.01); *H01L 21/02211* (2013.01); *H01L 21/02216* (2013.01); *H01L 21/02274* (2013.01); *H01L 21/02348* (2013.01)

(58) Field of Classification Search
CPC .................................................. H01L 21/02348
See application file for complete search history.

(56) References Cited

U.S. PATENT DOCUMENTS

| | | |
|---|---|---|
| 6,441,491 B1 | 8/2002 | Grill et al. |
| 6,846,515 B2 | 1/2005 | Vrtis et al. |
| 6,887,578 B2 | 5/2005 | Gleason et al. |
| 7,202,564 B2 | 4/2007 | Nguyen et al. |
| 7,479,306 B2 | 1/2009 | Edelstein et al. |
| 7,491,658 B2 | 2/2009 | Nguyen et al. |
| 7,494,938 B2 | 2/2009 | Nguyen et al. |
| 7,674,521 B2 | 3/2010 | Gates et al. |

(Continued)

OTHER PUBLICATIONS

Gates, S. M., et al.; "Adjusting the Skeleton and Pore Structure of Porous SiCOH Dielectrics"; Journal of the Electrochemical Society; vol. 156, No. 10; p. G156-G162; 2009.

(Continued)

*Primary Examiner* — Stephen W Smoot
(74) *Attorney, Agent, or Firm* — Cantor Colburn LLP; Steven Meyers

(57) ABSTRACT

Disclosed herein is an ultra-low dielectric (k) film and methods of making thereof. A ultra-low k film has a covalently bonded network comprising atoms of silicon, oxygen, carbon, and hydrogen, a cyclotrisilane structure, and a plurality of pores having a pore size distribution (PSD) of less than about 1.1 nanometers (nm). The ultra-low k film has a k value of less than about 2.4 and at least about 28 atomic percent of carbon.

19 Claims, 4 Drawing Sheets

(56) References Cited

U.S. PATENT DOCUMENTS

| | | | |
|---|---|---|---|
| 7,915,180 B2 | | 3/2011 | Gates et al. |
| 9,209,017 B2* | | 12/2015 | Canaperi ............ H01L 21/02348 |
| 2004/0020601 A1 | | 2/2004 | Zhao et al. |
| 2007/0009673 A1 | | 1/2007 | Fukazawa et al. |
| 2010/0052114 A1* | | 3/2010 | Hara ...................... C07F 7/21 |
| | | | 257/632 |
| 2010/0123223 A1 | | 5/2010 | Ito et al. |
| 2011/0206857 A1 | | 8/2011 | Yim et al. |
| 2011/0241200 A1 | | 10/2011 | Dimitrakopoulos et al. |
| 2012/0135611 A1 | | 5/2012 | Ito et al. |
| 2013/0043514 A1 | | 2/2013 | Grill et al. |
| 2013/0175680 A1 | | 7/2013 | Gates et al. |

OTHER PUBLICATIONS

Gates, S. M., et al.; "Preparation and Structure of Porous Dielectrics by Plasma Enhanced Chemical Vapor Deposition"; Journal of Applied Physics; vol. 101; p. 094103-1-094103-8; 2007.

Grill, Alfred, et al.; "Characterization of Low-k to Extreme Low-k SiCOH Dielectrics"; Electrochmical Society Proceedings; p. 315-322; 2003.

Hayashi, Yoshihiro, et al.; "Comprehensive Chemistry Designs in Porous SiOCH Film Stacks and Plasma Etching Gases for Damageless Cu Interconnects in Advanced ULSI Devices"; IEEE Transactions on Semiconductor Manufacturing; vol. 21, No. 3; p. 469-480; Au.

Makarova, A. N., et al.; "Synthesis of Organosiloxanes with Reactive Groups at Silicon Atoms"; Russian Chemical Bulletin; vol. 45, No. 4; p. 914-915; Apr. 1996.

Tada, Munehiro, et al.; "Chemical Structure Effects of Ring-Type Siloxane Precursors on Properties of Plasma-Polymerized Porous SiOCH Films"; Journal of the Electrochemical Society; vol. 154, No. 7; p. D354-D361; 2007.

Trujillo, Nathan J., et al.; "Ultralow Dielectric Constant Tetravinyltetramethylcyclotetrasiloxane Films Deposited by Initiated Chemical Vapor Deposition (iCVD)"; Advanced Functional Materials; vol. 20; p. 607-616; 2010.

Yamamoto, H., et al.; "Control of Plasma Polymerization Reaction for the 2nd Generation Molecular_Pore_Stack (MPS) SiOCH Film with High Deposition Rate"; Interconnect Technology Conference and 2011 Materials for Advanced Metallization (IITC/MAM), 2011 IE; p. 1-3.

* cited by examiner

US 9,449,810 B2

ADVANCED ULTRA LOW K SICOH DIELECTRICS PREPARED BY BUILT-IN ENGINEERED PORE SIZE AND BONDING STRUCTURED WITH CYCLIC ORGANOSILICON PRECURSORS

PRIORITY

This application is a continuation of and claims priority from U.S. patent application Ser. No. 14/225,810, filed on Mar. 26, 2014, now U.S. Pat. No. 9,209,017 issued on Dec. 8, 2015, entitled "ADVANCED ULTRA LOW K SICOH DIELECTRICS PREPARED BY BUILT-IN ENGINEERED PORE SIZE AND BONDING STRUCTURED WITH CYCLIC ORGANOSILICON PRECURSORS", the entire contents of which are incorporated herein by reference.

BACKGROUND

The present disclosure generally relates to ultra-low dielectric films and methods of forming the same.

Integrated circuits in electronic devices involve semiconductor device fabrication. A sequence of photolithographic and chemical processing steps creates the electronic circuits on a wafer of semiconducting material. Silicon is frequently used as the semiconducting material, although the semiconducting material used depends on the application. The semiconducting wafers are then subjected to front-end-of-line (FEOL) processing and back-end-of-line (BEOL) processing. FEOL processing includes forming the transistors directly in the silicon. BEOL processing includes interconnecting the respective semiconductor devices to form the electrical circuits. In particular, interconnecting metal wires isolated by insulating layers are created. The insulating material can be silicon dioxide or low dielectric constant (k) materials.

As line dimensions are reduced to increase the speed and memory storage capability of microelectronic devices (e.g., computer chips), the insulating requirements for the interlayer dielectric (ILD) become much more rigorous. Reduced size and dimensions in these devices requires a lower k to minimize the RC time constant, where R is the resistance of the conductive line and C is the capacitance of the insulating dielectric interlayer. C is inversely proportional to spacing and proportional to the k of the ILD.

Many of the fabrication steps of very large scale integration (VLSI) and ultra-large scale integration (ULSI) chips are carried out by plasma enhanced chemical or physical vapor deposition techniques. The ability to fabricate an ultra-low k material by a plasma enhanced chemical vapor deposition (PECVD) technique using previously installed and available processing equipment thus simplifies its integration in the manufacturing process, reduces manufacturing cost, and creates less hazardous waste.

Furthermore as electronic devices decrease in size, the thickness of the dielectric insulator film layers accordingly decrease. Thus, the dielectric layers are subject to an increased propensity to degrade, or wear-out, which is known as time-dependent dielectric breakdown (TDDB).

Ultra-low k materials and films having atoms of Si, C, O and H (SiCOH) can be non-porous, or porous. Porous films can be formed by introducing a labile porogen group during the deposition of a preliminary film structure, which is subsequently removed using a conventional curing process. Porous SiCOH films may have a lower k than the corresponding non-porous SiCOH films.

Ultra-low k SiCOH films, however, may have poor mechanical properties, such as, for example, a high crack velocity and stress, and a low modulus and hardness. Further, SiCOH dielectric films may deteriorate as the k of the material decreases. Hence, porous SiCOH dielectrics may have disfavored mechanical properties compared to the corresponding non-porous SiCOH dielectrics.

Improved mechanical properties of low k or ultra-low k SiCOH dielectrics can be achieved by treating the SiCOH films post deposition. For example, curing or treatment using thermal, UV light, electron beam irradiation, chemical energy or a combination of these energy sources has been used to stabilize the low or ultra-low k dielectric material and to improve the mechanical properties of the same. While such post deposition treatments are possible, they add extra processing steps and thus cost to the manufacturing of low k or ultra-low k dielectric films.

SUMMARY

In one embodiment of the present disclosure, an ultra-low dielectric (k) film includes a covalently bonded network having atoms of silicon, oxygen, carbon, hydrogen, and a cyclotrisilane structure; and a plurality of pores having a pore size distribution (PSD) of less than about 1.1 nanometers (nm). The ultra-low k film has a k value of less than about 2.4 and has at least about 28 atomic percent of carbon.

In another embodiment, a method of forming an ultra-low k film includes flowing a single precursor comprising a cyclotrisilane structure at a temperature between about 100 and about 300° C. to deposit a preliminary film comprising a porogen onto a substrate; and removing at least a portion of the porogen from the preliminary material to form the ultra-low k film. The ultra-low k film has at least 28 atomic percent carbon and has an ultra-low k value of less than about 2.4.

Yet, in another embodiment, a method of forming an ultra-low k film includes flowing a single precursor at an RF power of less than about 400 W to deposit a preliminary material having a porogen onto a substrate; and UV curing the preliminary film to remove at least a portion of the porogen from the preliminary film to form the ultra-low k film. The ultra-low k film has at least 40 atomic percent carbon and has an ultra-low k value of less than about 2.4. Further, the single precursor has the following structure:

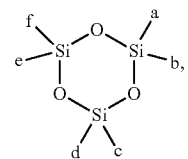

and
wherein a, b, c, d, e, and f are each independently an alkyl group, an alkenyl group, an alkoxy group, an epoxy group, a phenyl group, or an alkynyl group.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
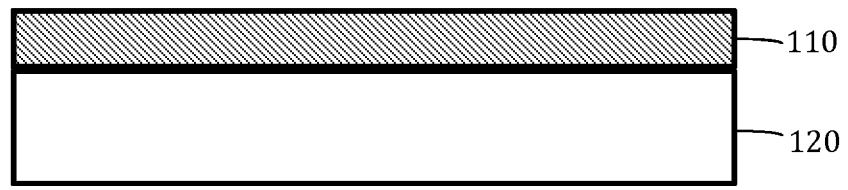
FIG. 1 illustrates a cross-sectional view of an embodiment the inventive ultra-low k film on a substrate.

In view of the above, there is a need for an ultra-low k film which exhibits favorable electronic and mechanical properties. Accordingly, disclosed herein is an ultra-low k film and methods of making thereof. In one aspect, an ultra-low k film has a covalently bonded network comprising atoms of silicon, oxygen, carbon, hydrogen, and a cyclotrisilane ring structure. The film has a plurality of pores having a pore size distribution (PSD) of less than about 1.1 nanometers (nm). Further, the ultra-low k film has a k value of less than about 2.4 and includes at least about 28 atomic percent of carbon.

In another aspect, a method of forming an ultra-low k film includes flowing a single precursor comprising a cyclotrisilane structure at a temperature between about 100 and about 300° C. to deposit a preliminary film comprising a porogen on a substrate and removing at least a portion of the porogen from the preliminary film to form the ultra-low k film. The ultra-low k film has at least 28 atomic percent carbon and has an ultra-low k value of less than about 2.4.

In another aspect, a method of forming an ultra-low k film includes flowing a single precursor using a plasma enhanced chemical vapor deposition process at an RF power of less than about 400 watts in a 300 mm diameter commercial chemical vapor deposition (CVD) reactor to deposit a preliminary material comprising a porogen on a substrate and ultra-violet (UV) curing the preliminary film to remove at least a portion of the porogen from the preliminary film to form the ultra-low k film. Alternatively, another energy source, such as, a thermal source, an electron beam, a plasma source, a microwave source, or an optical radiation source, such as a UV or laser beam can be used. The ultra-low k film has at least 40 atomic percent carbon and has an ultra-low k value of less than about 2.4. The single precursor has the following structure:

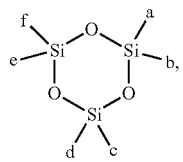

and a, b, c, d, e, and f are each independently an alkyl group, an alkenyl group, an alkoxy group, an epoxy group, a phenyl group, or an alkynyl group. The single precursor has a small built-in pore radius, which is defined as the diagonal distance from O to Si, of about ~0.8-0.9 nm in the precursor structure, depending on the attached a, b, c, d, e, and f groups.

As used herein, the term "substrate" means a single layer or a multi-layer material having a surface, including, but not limited to, a semi-conducting material, an insulating material, a conducting material, or any combination thereof.

As used herein, the terms "dielectric," "k," and "dielectric constant" mean the ratio of permittivity of the medium to the permittivity of air in a vacuum. As used herein, the terms "ultra-low dielectric" and "ultra-low k" mean a value less than about 2.7.

As used herein, the term "film" means a layer of a material having a thickness in a range between about 10 and about 1000 nm. Although, optionally, oxidizing gases and inert gases may be present during formation of the film, the films of the present invention are made from a single precursor molecule including a labile porogen group and in-built porosity from the disclosed ring structure. In one embodiment, the films of the present invention are substantially free of a second precursor. In another embodiment, the films of the present invention are substantially free of fluorine (F) atoms.

As used herein, the term "porogen" means a labile, removable functional group that is present in and covalently bonded to a single precursor molecule forming the film. At least a portion of the porogen is subsequently removed by an energetic treatment step to provide a porous final ultra-low k film, with additional cross-linking to improve mechanical properties of the film. Thus, at least a portion of the porogen is not present in the final ultra-low k film. The energetic treatment step creates pores, or voids, in the final film. As used herein, the term "pore" means a void or a hole in the film.

Turning now to the figures, FIG. 1 is an illustration of a cross-sectional view of the inventive ultra-low k film 110 disposed on a substrate 120. The substrate 120 is not intended to be limited and can by any metal, semiconducting material, conducting material, insulating material, or a combination thereof. Non-limiting examples of semiconducting materials include Si, SiGe, SiGeC, SiC, GaAs, InAs, InP and other III/V or II/VI compound semiconductors. The substrate 120 can also include a layered substrate such as, for example, Si/SiGe, Si/SiC, silicon-on-insulators (SOIs) or silicon germanium-on-insulators (SGOIs).

When substrate 120 is an insulating material, the insulating material can be an organic insulator, an inorganic insulator or a combination thereof, including multilayers. When the substrate 120 is a conducting material, the substrate 120 may include, for example, polySi, an elemental metal, alloys of elemental metals, a metal silicide, a metal nitride and combinations thereof, including multilayers. The substrate 120 can include a combination of a semiconducting material and an insulating material, a combination of a semiconducting material and a conductive material or a combination of a semiconducting material, an insulating material, and a conductive material. When the substrate 120 includes a semiconductor material, one or more semiconductor devices, such as complementary metal oxide semiconductor (CMOS) devices can be fabricated thereon.

The inventive ultra-low k film 110 disposed on the substrate 120 includes a porous dielectric material with atoms of silicon (Si), carbon (C), oxygen (O), and hydrogen (H), which form an organosilicon or organosilate material (SiCOH), also called C-doped oxide (CDO) or organosilicate glass (OSG). The thickness of the ultra-low k film 110 may vary and depends on the desired application. The film 110 thickness can be in a range between about 10 and about 10,000 nanometers (nm). In one aspect, the film 110 thickness is in a range between about 50 nm and about 1 micrometer. In another aspect, the film 110 thickness is in a range between about 60 and about 500 nm. Yet, in another aspect, the film 110 thickness is in a range between about 70 and about 100 nm.

The dielectric constant of the inventive film 110 is less than about 2.7. In one aspect, the k is less than about 2.5. Yet, in another aspect, the k is less than about 2.3. Still yet, in another aspect, the k of the inventive film 110 is less than about 1.8.

The inventive ultra-low k film 110 has a covalently bonded network of atoms of Si, C, O, and H. The atoms form a tri-dimensional network structure in which Si, C, O, and H are interconnected and interrelated in the x, y and z directions. The inventive ultra-low k film 110 includes a high percentage of C, which enhances cross-linking in the film. Further, a higher C content provides favorable properties, including lower plasma induced damage (PID), a smaller average pore size, and an improved modulus.

In one aspect, the inventive film 110 includes at least about 28 atomic percent C. In another aspect, the inventive film 110 has at least about 35 atomic percent C. Yet, in another aspect, the inventive film 110 has at least about 40 atomic percent C. Still yet, in another aspect, the inventive film 110 includes between about 35 and about 70 atomic percent C. In one aspect, the inventive film 110 includes about or in any range between about 35, 40, 45, 50, 55, 60, 65, and 70 atomic percent C.

Accordingly, the inventive film 110 includes between about 10 and about 40 atomic percent of Si; between about 10 and about 40 atomic percent of O; and between about 10 and about 55 atomic percent of H.

The ultra-low k film 110 includes a cyclotrisilane group, a ring structure. The cyclotrisilane structure is a six-membered ring of 3 Si atoms alternating with 3 O atoms. Compared to cyclic precursors including 4 Si atoms, the cyclotrisilane precursors of the present invention provide porous films with smaller, built-in pore radii and with improved mechanical and electrical properties.

In the final film, each of the three Si atoms of the ring can be attached to one or two C-containing functional groups, for example alkyl groups or alkenyl groups. Although a portion of the C-containing functional groups attached to the Si may function as labile porogens in the preliminary film and be absent in the final film, forming pores (discussed below), at least a portion of the C-containing functional groups may be present in the final film. Thus, the Si atoms in the ring of the final film may be attached to at least a portion of the C-containing porogen groups.

The labile porogen groups in the single molecule precursor, a portion of which may remain in the final ultra-low k film, include, but are not limited to, an alkyl group, an alkenyl group, an alkoxy group, an epoxy group, a phenyl group, or an alkynyl group, all of which may be linear, branched, cyclic, polycyclic or functionalized with oxygen, nitrogen or fluorine containing substituents. The alkyl group can be a methyl group, an ethyl group, a propyl group, a butyl group, or a pentyl group, and the alkenyl group can be an ethenyl group (vinyl group). Each of the C-containing functional groups are independently selected, and each Si atom of the ring can be attached to the same or different C-containing functional groups.

When the porogen is a vinyl group, increased cross-linking can occur in the final ultra-low k film, which improves electrical and mechanical properties of the film. For example, when vinyl groups are the porogen group, increased Si—$(CH_2)_x$—Si bonding can occur during subsequent UV curing or annealing steps, which is described below. Further, when the porogen is an unsaturated hydrocarbon chain, such as a vinyl group, the original single molecule structure is maintained, which reduces the dielectric constant within the final porous film. Further, large alkyl groups increase the C content in the final film, improving plasma resistance of the film.

As described in detail below, the ultra-low k film is formed from a single precursor having a built-in sacrificial organic porogen, which is removed in an energetic treatment step to generate pores and form a porous final ultra-low k film. The single precursors used to form the film provide for a smaller, controlled pore size with a higher atomic percent C and degree of cross-linking. Thus, the performance of the ultra-low k film, particularly in electrical time dependent dielectric breakdown (TDDB) in enhanced, as well as the mechanical properties.

According to the present invention, a single precursor molecule contains a porogen substituent that is thermally labile, or that may be decomposed by light, ionizing radiation, or the generation of catalytic species. A preliminary film is formed containing the porogen groups. Formation of the preliminary film may include formation of a prepolymer by solution phase chemistry. The pre-polymer is then coated on a substrate and solvent is removed to form the preliminary film. Other methods to form the preliminary film are also described within the invention. Then, the porogen substituent groups are removed in the energetic treatment step.

The resulting final ultra-low k film contains nanometer scale porosity that is formed by removal of the porogen groups. Herein, the labile/decomposable substituents in the single molecule precursor are also called "built-in sacrificial organic porogens." In one embodiment, the single precursor molecule also contains a combination of Si—$CH_2$—Si and Si—O bonds that will form the skeleton of the final ultra-low k film. In another embodiment, the final film includes Si—$(CH_2)_x$—Si bonding units or Si—$CH_2$—$CH_2$—Si bonding units.

The preliminary film may be deposited using any deposition method, for example spin-on coating, plasma enhanced chemical vapor deposition (PECVD), thermal chemical vapor deposition, evaporation, or other methods. To form the porous final ultra-low k film, energy is applied to the preliminary film in the form of thermal energy, UV light, microwave, electron beam, ion beam or other energy source, such as a catalytic species. In some embodiments, a combination of two or more of these energy sources is employed. These energy input methods transforms the preliminary film into the final porous ultra-low k film. Specifically, removal of at least a portion of the labile porogen group from the preliminary film provides a porous film as described below. Because of the structure of the precursor, with a cyclotrisilane structure, smaller substantially non-interconnected pores are provided, for example compared to other cyclic tetrasilane precursors, e.g., octamethyl cyclotetrasilane (OMCTS) and tetramethyl cyclotetrasilane (TM-CTS).

The following illustrates a schematic of the precursor to final porous ultra-low k film formation. In particular, the single precursor has the following structure:

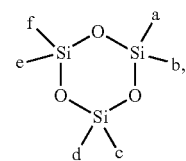

and a, b, c, d, e, and f are each independently an alkyl group, an alkenyl group, an alkoxy group, an epoxy group, a phenyl group, or an alkynyl group. This single precursors has a smallest built-in pore radius (diagonal distance from O to Si) of about ~0.8-0.9 nm in the precursor structure depending on the attached a, b, c, d, e, f groups. In an exemplary embodiment, the resulting film has the following structure post-UV curing treatment:

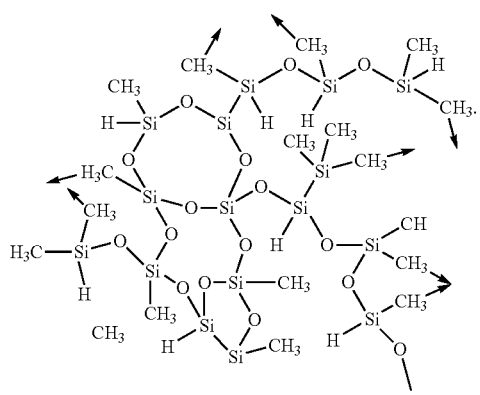

The pores of the inventive film 110 of the present invention are characterized by a pore size distribution (PSD), which has a maximum value of 2 nm as measure by an absorption process. Advanced non-destructive techniques, such as ellipsometric porosimetry (EP), small-angle neutron and X-ray scattering (SAXS) combined with specular X-ray reflectivity (XRR) and positron annihilation lifetime spectroscopy (PALS), are used for porosity measurements. In one aspect, the ultra-low k film 110 has a PSD of less than about 1.1 nm, less than about 0.9 nm, or less than about 0.7 nm. In another aspect, the ultra-low k film has a PSD in a range between about 0.5 and about 2 nm. In another aspect, the ultra-low k film 110 has a PSD about or in any range between about 0.5, 0.6, 0.7, 0.8, 0.9, 1.0, 1.1, 1.2, 1.3, 1.4, 1.5, 1.6, 1.7, 1.8, 1.9, and 2.0 mm.

The films of the present invention have a porosity in a range between about 5 and about 45%. In another aspect, the films of the present invention have a porosity of at least about 5%. Yet, in another aspect, the inventive films have a porosity in a range between about 7 and about 25%. Still yet, in another aspect, the inventive films have a porosity in any range between about 5, 10, 20, 25, 30, 35, 40, and 45%.

The chemical structure and nature of the single precursor provides for enhanced mechanical properties in the final ultra-low k film 110. The inventive film 110 has a modulus of at least about 6 gigapascals (GPa). In one aspect, the inventive film 110 has a modulus in a range between about 6 and about 18 GPa. In another aspect, the inventive film 110 has a modulus in a range between about 6 and about 12 GPa. Yet, in another aspect, the inventive film 110 has a modulus in a range between about 7 and about 10 GPa.

Figure 2:
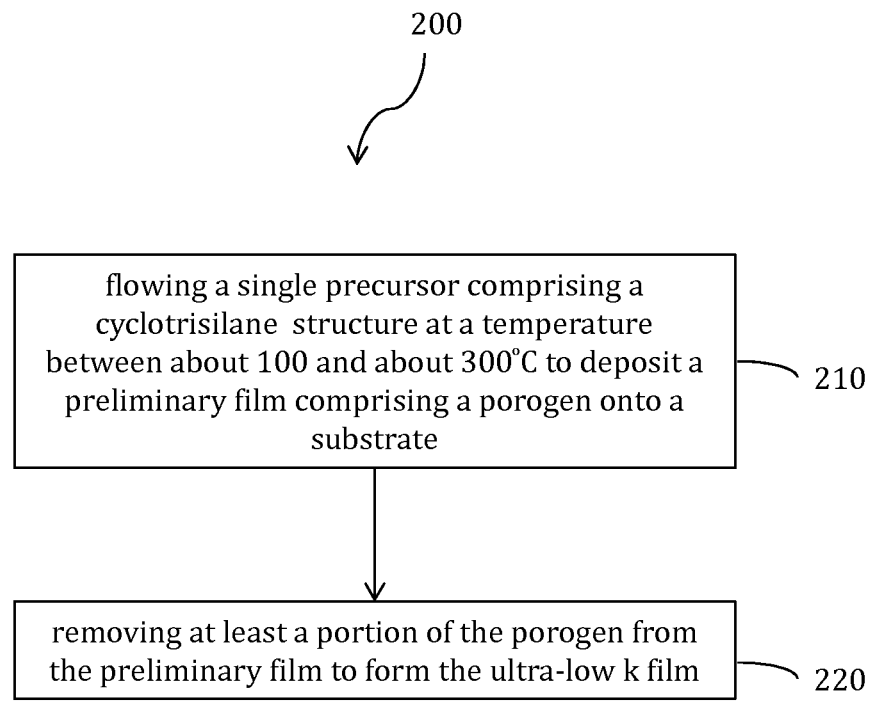
FIG. 2 illustrates a block diagram of an exemplary method of making the ultra-low k film of FIG. 1.

FIG. 2 illustrates an exemplary method 200 of forming the inventive film 110. In block 210, a single precursor including a cyclotrisilane structure is flowed at a temperature between about 100 and about 300° C. to deposit a preliminary film comprising a porogen on a substrate. In block 220, at least a portion of the porogen is removed from the preliminary material to form the ultra-low k film. The final ultra-low k film includes at least 28 atomic percent C and has an ultra-low k value of less than about 2.4.

Initially, the substrate 120 in placed in a reactor chamber, such as a plasma enhanced chemical vapor deposition (PECVD) reactor chamber. Then, the single precursor, which can be in the form of a liquid, gas, or vapor and includes atoms of Si, C, O, and H and a cyclotrisilane structure are introduced into the chamber. Then the single precursor forms a preliminary material on the substrate under conditions effective in forming the inventive film.

The single precursor has a cyclotrisilane structure, which can have the following structure:

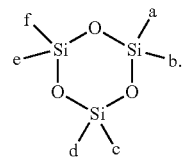

The a, b, c, d, e, and f groups are each independently an alkyl group, an alkenyl group, an alkoxy group, an epoxy group, a phenyl group, or an alkynyl group. The alkyl group can be a methyl group, an ethyl group, a propyl group, a butyl group, or a pentyl group. The alkenyl group can be an ethenyl group, a propenyl group, a butenyl group, or a pentenyl group.

In one embodiment, the single precursor is 2,2,4,4,6,6-hexaethyl-tricyclosiloxane. In another embodiment, the single precursor is 1,3,5-trivynyl-1,3,5-trimethylcyclotrisiloxane.

Methods of making cyclic organosiloxanes are known to those in the art. A non-limiting exemplary method of making cyclic organosiloxane molecules is described in Makarova, N. N., et al. (1996) Synthesis of Organosiloxanes with Reactive Groups at Silicon Atoms, Russian Chemical Bulletin 45, 914-919, which is incorporated herein in its entirety by reference.

Optionally, an oxidizing gas or an inert gas is present in the chamber while the single precursor is being deposited. The oxidizing gas may be present in an amount of less than about 10% compared to the single molecule precursor. For example, the oxidizing gas may be present in an amount of less than about 9, 8, 7, 6, 5, 4, 3, 2, or 1% compared to the single molecule precursor. Using a limited amount of an oxidizing gas promotes retention of the built-in pore structure, maintains at least a portion of the porogen groups (e.g., the vinyl groups when a vinyl group is the porogen), and promotes a high C content in the final ultra-low k film.

Non-limiting examples of oxidizing gases include carbon dioxide, oxygen, nitrous oxide, or any combination thereof. The oxidizing gas may be used to stabilize the reactant in the reactor and to improve the uniformity of the ultra-low k film deposited on the substrate. Non-limiting examples of inert gases include helium, argon, neon, xenon, or a combination thereof.

The conditions for depositing the film may vary depending on the desired final dielectric constant of the ultra-low k film. However, using a low temperature provides for a film with a high C-content by allowing for at least a portion of the labile organic porogen groups to remain in the final film. The temperature for providing the ultra-low k film on the substrate can be in a range between about 100 and about 300° C. In another aspect, the temperature can be set to a temperature in a range between about 180 and about 250° C. Yet, in another aspect, the temperature during forming the ultra-low k film can be about or in any range between about 100, 110, 120, 130, 140, 150, 160, 170, 180, 190, 200, 210, 220, 230, 240, 250, 260, 270, 280, 290, and 300° C.

Figure 3:
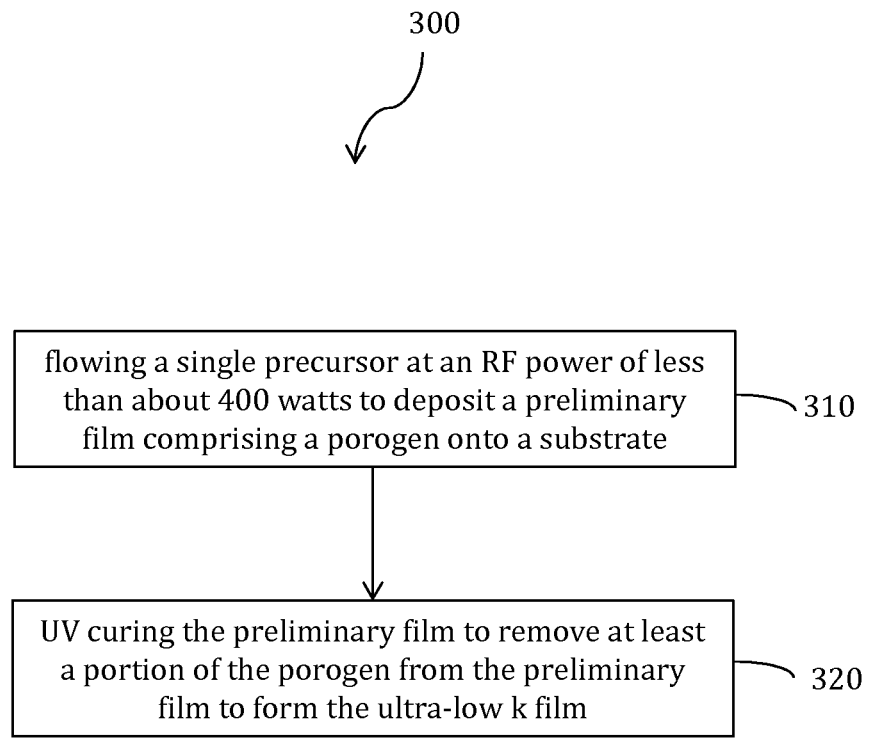
FIG. 3 illustrates a block diagram of another exemplary method of making the ultra-low k film of FIG. 1.

FIG. 3 illustrates an exemplary method 300 of forming the inventive film. In block 310, a single precursor is flowed at an RF power of less than about 400 watts to deposit a preliminary film comprising a porogen onto a substrate. In block 320, the preliminary film is UV cured to remove at least a portion of the porogen from the preliminary film to form the ultra-low k film. Method 300 is but an exemplary method. Other embodiments of method 300 can be used.

A low RF power is used to deposit the preliminary film. In one aspect, a low RF power of less than about 500 W is used. In another aspect, a low RF power of less than about 400 W is used. Still yet, in another aspect, a low RF power of less than about 300 W is used. In one aspect, a low RF power about or in any range between about 100, 120, 140, 160, 180, 200, 220, 240, 260, 280, 300, 320, 340, 360, 380, 400, 420, 440, 460, 480, and 500 W is used.

In an exemplary embodiment for forming the ultra-low k film, the precursor flow rate can be in a range between about 10 and about 3,000 milligrams per minute (mg/min); the flow rate of the oxidizing gas can be in a range between about 5 and about 2000 standard cubic centimeters (sccm); the flow rate of the inert carrier gas is in a range between about 10 and about 3,000 sccm; the low frequency RF power density is less than about 0.4 watts/centimeter$^2$ (W/cm$^2$); the reactor pressure is in a range between about 1 and about 10 Torr; the high frequency RF power is between about 100 and about 800 W; and the low RF power is less than about 400 W.

In another embodiment for forming the ultra-low k film, the precursor flow rate can be in a range between about 500 and about 1000 mg/min; the flow rate of the oxidizing gas can be in a range between about 50 and about 200 sccm; the flow rate of the inert carrier gas is in a range between about 200 and about 1000 sccm; the low frequency RF power density is less than about 0.2 W/cm$^2$; the reactor pressure is in a range between about 5 and about 8 Torr; the high frequency RF power is between about 200 and about 500 W; and the low frequency power is less than about 200 W.

After initial deposition of the single precursor, a preliminary film having a labile porogen group is formed on the substrate. The preliminary film is then treated to remove at least a portion of the porogen group and provide a porous final film. The subsequent treatment to form the porous ultra-low k film can be performed using an energy source, such as thermal, electron beam, plasma, microwave, or optical radiation, such as a UV or laser. In one embodiment, UV curing is used to remove at least a portion of the porogen from the preliminary film to provide the described porous film. Combinations of the aforementioned energy sources can also be used in the present invention. These energetic steps reduce the k value and increase cross-linking in the final film.

Non-limiting examples of the thermal energy sources include any source, such as, for example, a heating element or a lamp, that can heat the deposited preliminary film to a temperature up to about 450° C. In another aspect, the thermal energy source is capable of heating the deposited preliminary film to a temperature from about 200 to about 450° C.; or from about 350 to about 425° C. This thermal treatment process can be carried out for various time periods, for example from about 0.5 minutes to about 30 minutes. The thermal treatment can be performed in the presence of an inert gas, such as helium, argon, neon, xenon, nitrogen, or any combination thereof. The thermal treatment may be referred to as an anneal step in which rapid thermal anneal, furnace anneal, laser anneal, or spike anneal conditions are employed.

In some embodiments, the thermal treatment can be performed in the presence of a gas mixture containing a hydrogen source gas, such as, for example, hydrogen gas or a hydrocarbon. In yet other embodiments, the thermal treatment can be performed in the presence of a gas mixture containing a very low partial pressure of oxygen gas and water.

UV curing can be performed to remove at least a portion of the porogen in the preliminary film. UV curing is performed using a source that can generate light having a wavelength from about 500 to about 150 nm, or from about 370 to about 150 nm. The UV light is used to irradiate the substrate with the preliminary film while maintaining the substrate at a desired temperature. In one embodiment, the temperature during UV curing can be in a range between about 100 and about 500° C. In another embodiment, the temperature during UV curing temperature is in a range between about 200 and about 450° C. Yet, in another embodiment, the temperature during UV curing is in a range between about 350° C. and 425° C. UV curing may be performed in the presence of an inert gas, a hydrogen source gas, or a gas mixture of oxygen pressure and water. UV curing reduces the k value and increases cross-linking in the final film.

When an electron beam treatment step is performed on the preliminary film, a source capable of generating a uniform electron flux is used. The energy of the electron beam can have energies from 0.5 to 25 keV and current densities from 0.1 to 100 microAmp/cm$^2$. The temperature of the substrate and preliminary film is maintained at a temperature up to 450° C., or at a temperature from about 200 to about 450° C., or at a temperature from about 350 to about 425° C. The dose of electrons used in the electron beam treatment can be from 50 to 500 microcoulombs/cm$^2$, or from about 100 to about 300 microcoulombs/cm$^2$ range. The electron beam treatment may be performed in the presence of an inert gas, a hydrogen source gas, or a gas mixture of oxygen and water.

The plasma treatment is performed utilizing a source that is capable of generating atomic hydrogen (H), and optionally CH$_3$ or other hydrocarbon radicals. Downstream plasma sources or direct plasma exposure may be used. During plasma treatment, the substrate with the preliminary film disposed thereon is maintained at a temperature up to 450° C., or at a temperature from 200 to about 450° C., or at a temperature from about 350 to about 425° C.

The plasma treatment is performed by introducing a gas into the reactor that is then converted into plasma. The gas used for the plasma treatment includes, but is not limited to, inert gases, such as argon, nitrogen, helium, xenon, or krypton; hydrogen or related sources of atomic hydrogen, methane, methylsilane, related sources of CH$_3$ groups, or any combination thereof. The flow rate of the plasma treatment gas may vary depending on the reactor system being used. The chamber pressure can range anywhere from 0.05 to 20 Torr, or from about 1 to 10 Torr. The plasma treatment is performed for a time in a range between about 0.5 to about 10 minutes, although longer times may be used.

An RF or microwave power source may be used to generate the plasma. The RF power source may operate at either a high frequency range (on the order of about 100 W or greater); a low frequency range (less than 250 W), or a combination thereof may be employed. The high frequency power density can range anywhere from about 0.1 to 2.0 W/cm$^2$, or from about 0.2 to 1.0 W/cm$^2$. The low frequency power density can range anywhere from 0.1 to 1.0 W/cm$^2$, or from about 0.2 to 0.5 W/cm$^2$.

In addition to the above treatments, a deep ultra-violet (DUV) laser source can also be employed. The laser source used to treat the deposited preliminary film can be an excimer laser which operates at one of several DUV wavelengths, depending on the laser gas mixture. For example, a XeF laser which produces 308 nm radiation can be employed. Also, a KrF laser that produces 248 nm radiation, or a ArF laser that produces 193 nm radiation, or a 157 nm radiation F laser, can be employed in the present invention.

Any of the above described treatment steps are optional and may be used alone or in combination to provide a porous ultra-low k film as described herein.

Figure 4:
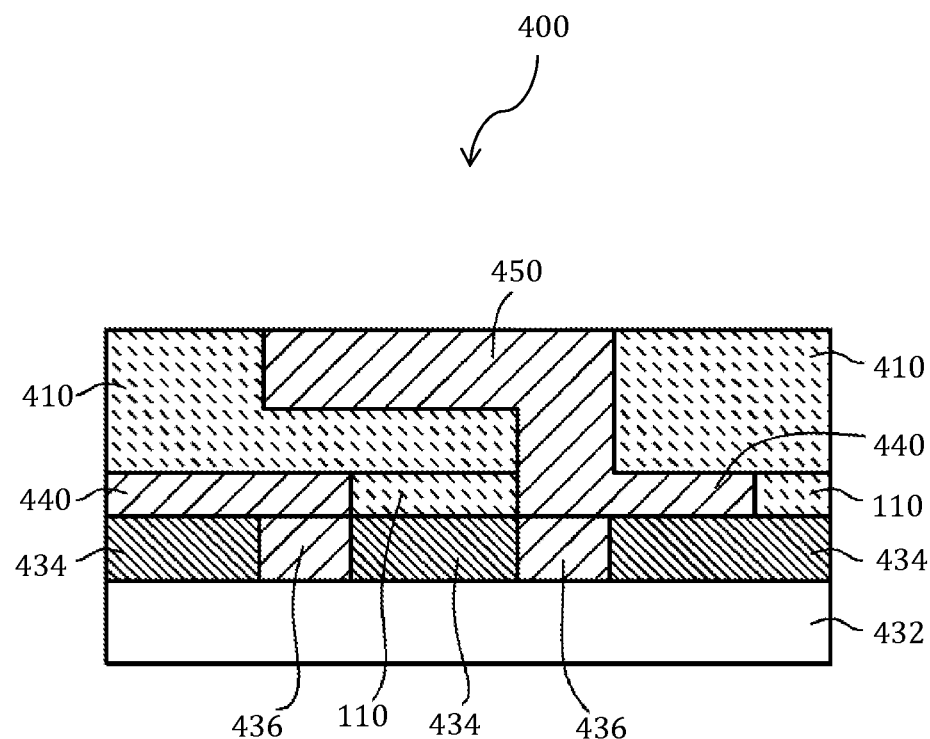
FIG. 4 illustrates a cross-sectional view of an exemplary electronic device including the inventive ultra-low k film.

The ultra-low k film of the present invention can be used in a variety of electronic devices and structures, including, but not limited to ULSI circuits and related structures. FIG. 4 illustrates an exemplary embodiment of an electronic device in which the inventive ultra-low k film can be used. It should be noted, however, the device of FIG. 4 is merely illustrative example of the present invention, and an infinite number of other devices may also be formed by the present invention.

In FIG. 4, an exemplary embodiment of electronic device 400 built on a silicon substrate 432 is shown. On top of the silicon substrate 432, an insulating material layer 434 is first formed with a first region of metal 436 embedded therein. After a chemical/mechanical polishing (CMP) process is conducted on the first region of metal 436, the ultra-low k film 110 of the present invention is deposited on top of the first layer of insulating material 434 and the first region of metal 436. The first layer of insulating material 434 may be suitably formed of silicon oxide, silicon nitride, doped varieties of these materials, or any other suitable insulating materials. The ultra-low k film 110 is then patterned in a photolithography process followed by etching and a conductor layer 440 is deposited thereon. After a CMP process on the first conductor layer 440 is carried out, a second layer of the inventive ultra-low k film 410 is deposited by a plasma enhanced chemical vapor deposition process overlying the first ultra-low k film layer 110 and the first conductor layer 440. The conductor layer 440 may be deposited of a metallic material or a nonmetallic conductive material. For instance, a metallic material of aluminum or copper, or a nonmetallic material of nitride or polysilicon. The first conductor 440 is in electrical communication with the first region of metal 436.

A second region of conductor 450 is then formed after a photolithographic process on the inventive ultra-low k film 410 is conducted followed by etching and then a deposition process for the second conductor material. The second region of conductor 450 may also be deposited of either a metallic material or a nonmetallic material, similar to that used in depositing the first conductor layer 440. The second region of conductor 450 is in electrical communication with the first region of conductor 440 and is embedded in the second layer of the inventive ultra-low k film 410. The second layer of the inventive ultra-low k film 410 is in intimate contact with the first layer of the inventive ultra-low k film 110. In this example, the first layer of the inventive ultra-low k film 110 is an intra-level dielectric material, while the second layer of the inventive ultra-low k film 410 is both an intra-level and an inter-level dielectric. It is to be noted that the electronic device 400 is but an exemplary embodiment and not intended to be limiting. The ultra-low k film of the present invention may be used in other electronic devices.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. An ultra-low dielectric (k) film comprising:
   a covalently bonded network comprising atoms of silicon, oxygen, carbon, hydrogen, and a cyclotrisilane structure; and
   a plurality of pores having a pore size distribution (PSD) of less than about 2.0 nanometers (nm);
   wherein the ultra-low k film has a k value of less than about 2.7 and comprises about 35 to about 70 atomic % carbon and about 10 to about 40 atomic % silicon.

2. The ultra-low k film of claim 1, wherein the cyclotrisilane structure further comprises an alkyl group or an alkenyl group attached to at least one Si atom within the cyclotrisilane structure.

3. The ultra-low k film of claim 2, wherein the alkyl group is a methyl group, an ethyl group, a propyl group, a butyl group, or a pentyl group.

4. The ultra-low k film of claim 2, wherein the alkenyl group is an ethenyl group.

5. The ultra-low k film of claim 1, wherein the ultra-low k film has a modulus of at least about 6 gigapascals (GPa).

6. A method of forming an ultra-low k film, the method comprising:
   flowing a single precursor comprising a cyclotrisilane structure to deposit a preliminary film comprising a porogen onto a substrate; and removing at least a portion of the porogen from the preliminary film to form the ultra-low k film having an ultra-low k value of less than about 2.7 and comprising about 35 to about 70 atomic % carbon and about 10 to about 40 atomic % silicon.

7. The method of claim 6, wherein the single precursor is flowed at a radio frequency (RF) power of less than about 500 watts (W).

8. The method of claim 7, wherein the RF power is less than about 300 W.

9. The method of claim 6, wherein the ultra-low k film comprises a plurality of pores having a PSD of less than about 1.1 nm.

10. The method of claim 6, wherein the single precursor is 2,2,4,4,6,6-hexaethyl-tricyclosiloxane.

11. The method of claim 6, wherein the single precursor is 1,3,5-trivinyl-1,3,5-trimethylcyclotrisiloxane.

12. The method of claim 6, wherein the single precursor has a porosity in a range between about 5 and about 45%.

13. The method of claim 6, further comprising flowing the single precursor in the presence of an oxidizing gas.

14. The method of claim 13, wherein the oxidizing gas is carbon dioxide, oxygen, nitrous oxide, or any combination thereof.

15. A method of forming an ultra-low k film, the method comprising:
    flowing a single precursor to deposit a preliminary film comprising a porogen onto a substrate; and
    curing the preliminary film to remove at least a portion of the porogen from the preliminary film to form the ultra-low k film comprising about 35 to about 70 atomic % carbon and about 10 to about 40 atomic % silicon;
    wherein the single precursor has the following structure:

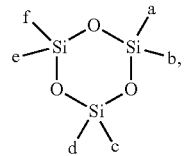

and
    wherein further a, b, c, d, e, and f are each independently an alkyl group, an alkenyl group, an alkoxy group, an epoxy group, a phenyl group, or an alkynyl group.

16. The method of claim 15, wherein the single precursor is flowed at a temperature in a range between about 180 and about 250° C.

17. The method of claim 15, wherein curing is UV curing in the presence of an inert gas.

18. The method of claim 15, wherein at least one of a, b, c, d, e, and f is an ethyl group or an ethenyl group.

19. The method of claim 15, wherein the ultra-low k film comprises a plurality of pores having a PSD of less than about 0.8 nm.

* * * * *